United States Patent
Wang et al.

(10) Patent No.: US 9,779,865 B2
(45) Date of Patent: Oct. 3, 2017

(54) VOLTAGE-CONTROLLED MAGNETIC DEVICES

(71) Applicant: THE ARIZONA BOARD OF REGENTS ON BEHALF OF THE UNIVERSITY OF ARIZONA, Tucson, AZ (US)

(72) Inventors: Weigang Wang, Tucson, AZ (US); Chong Bi, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 14/885,609

(22) Filed: Oct. 16, 2015

(65) Prior Publication Data
US 2016/0268029 A1 Sep. 15, 2016

Related U.S. Application Data

(60) Provisional application No. 62/065,460, filed on Oct. 17, 2014.

(51) Int. Cl.
| | |
|---|---|
| *H01F 7/04* | (2006.01) |
| *G11C 11/16* | (2006.01) |
| *H01Q 7/06* | (2006.01) |
| *G11C 11/15* | (2006.01) |

(52) U.S. Cl.
CPC ............... *H01F 7/04* (2013.01); *G11C 11/15* (2013.01); *G11C 11/161* (2013.01); *G11C 11/1675* (2013.01); *H01Q 7/06* (2013.01)

(58) Field of Classification Search
CPC ......... H01F 7/04; H01Q 7/06; G11C 11/1675; G11C 11/161; G11C 11/15
USPC .................................................. 365/158, 145
See application file for complete search history.

(56) References Cited

U.S. PATENT DOCUMENTS

| | | | | |
|---|---|---|---|---|
| 5,864,323 A * | 1/1999 | Berthon | ............. | G06K 19/0672 343/741 |
| 5,905,611 A * | 5/1999 | Yoda | ...................... | B82Y 10/00 360/324.1 |
| 5,936,810 A * | 8/1999 | Nakamoto | ............. | B82Y 10/00 360/322 |
| 6,535,416 B1 * | 3/2003 | Daughton | ............... | B82Y 25/00 365/145 |
| 6,652,906 B1 * | 11/2003 | Pinarbasi | ............... | G01R 33/09 427/130 |

(Continued)

FOREIGN PATENT DOCUMENTS

WO      2015139033 A1     9/2015

OTHER PUBLICATIONS

Bauer, Uwe, et al. "Magneto-ionic control of interfacial magnetism"; Nature Materials; vol. 14; Feb. 2015; pp. 174-181.

(Continued)

*Primary Examiner* — Vu Le
*Assistant Examiner* — Sung Cho
(74) *Attorney, Agent, or Firm* — Talem IP Law, LLP

(57) ABSTRACT

Voltage controlled magnetic components are described. The magnetic components include a thin layer of ferromagnet adjacent to an oxide layer. The magnetic properties of the ferromagnet may be controlled in a reversible manner via application of an external electric field and voltage-induced reversible oxidation of the ferromagnet.

18 Claims, 9 Drawing Sheets

(56) References Cited

U.S. PATENT DOCUMENTS

| | | | | |
|---|---|---|---|---|
| 6,704,230 | B1* | 3/2004 | DeBrosse | G06F 11/106 365/158 |
| 6,710,986 | B1* | 3/2004 | Sato | B82Y 10/00 360/324.2 |
| 6,753,562 | B1* | 6/2004 | Hsu | G11C 11/16 257/183 |
| 8,502,343 | B1* | 8/2013 | Jha | H01L 45/08 257/536 |
| 8,933,521 | B2* | 1/2015 | Nikonov | H01L 27/22 257/421 |
| 2006/0013039 | A1* | 1/2006 | Braun | G11C 11/15 365/171 |
| 2006/0017126 | A1* | 1/2006 | Bhattacharyya | G11C 11/16 257/421 |
| 2006/0067115 | A1* | 3/2006 | Gruber | B82Y 25/00 365/171 |
| 2006/0176620 | A1* | 8/2006 | Ravelosona | G11B 5/193 360/324.2 |
| 2010/0080048 | A1* | 4/2010 | Liu | G11C 11/16 365/157 |
| 2010/0090301 | A1* | 4/2010 | Lou | B82Y 25/00 257/421 |
| 2010/0193890 | A1* | 8/2010 | Suzuki | B82Y 10/00 257/421 |
| 2013/0029431 | A1* | 1/2013 | Takahashi | H01L 43/12 438/3 |
| 2013/0077391 | A1* | 3/2013 | Luo | H01L 43/08 365/158 |
| 2013/0114334 | A1* | 5/2013 | Yi | H01L 43/08 365/158 |
| 2013/0215672 | A1* | 8/2013 | Zhou | G11C 11/161 365/158 |
| 2013/0270661 | A1* | 10/2013 | Yi | G11C 11/161 257/421 |
| 2014/0043061 | A1* | 2/2014 | Behin-Aein | G06N 99/00 326/37 |
| 2014/0085969 | A1* | 3/2014 | Saida | G11C 11/1675 365/158 |
| 2014/0169085 | A1* | 6/2014 | Wang | G11C 11/161 365/158 |
| 2014/0247653 | A1* | 9/2014 | Wang | H01L 43/08 365/158 |
| 2014/0340961 | A1* | 11/2014 | Ohno | H01L 43/08 365/158 |
| 2015/0162080 | A1* | 6/2015 | Song | G11C 13/0069 365/148 |

OTHER PUBLICATIONS

Bauer, Uwe, et al. "Voltage-controlled domain wall traps in ferromagnetic nanowires"; Nature Nanotechnology; vol. 8; Jun. 2013; pp. 411-416.

Bauer, Uwe, et al. "Voltage control of magnetic anisotropy in Fe films with quantum well states"; Physical Review B; vol. 89, No. 174402; (2014); pp. 1-7.

Emori, Satoru, et al. "Generalized analysis of thermally activated domain-wall motion in Co/Pt multilayers"; Journal of Magnetism and Magnetic Materials; vol. 378; (2015); pp. 98-106.

Emori, Satoru, et al. "Large voltage-induced modification of spin-orbit torques in Pt/Co/GdOx"; Applied Physics Letters; vol. 105; No. 222401; (2014); pp. 1-4.

Fan, Xin, et al. "On-Chip Detection of Magnetic Dynamics for Single Microscopic Magnetic Dot"; IEEE Transactions on Magnetics; vol. 47; No. 2; Feb. 2011; pp. 359-361.

Hwang, Jungmin "Magnoelectric and Multiferroic Properties in Layered 3D Transition Metal Oxides"; Dissertation Paper; The Florida State University, College of Arts and Sciences, Department of Physics; Jul. 2012. Found on the Internet at: http://diginole.lib.fsu.edu/etd/5367/.

Maier, J. "Nanoionics: ion transport and electrochemical storage in confined systems"; Nature Materials; vol. 4; Nov. 2005; pp. 805-815.

Naik, V.B., et al. "Electric-field-induced strain-mediated magnetoelectric effect in CoFeB-Mgo magnetic tunnel junctions"; Cornell University; (2013); Found on the Internet at: arxiv.org/pdf/1311.3794.

Yang, et al. "Memristive devices for computing"; Nature Nanotechnology; vol. 8; Jan. 2013; pp. 13-24.

Yoda, H., et al. "Progress of STT-MRAM Technology and the Effect on Normally-off Computing Systems"; Conference Paper; Electron Devices Meeting (IEDM); 2012 IEEE International; Dec. 10-13, 2012; pp. 1-4.

Bauer, Uwe, et al. "Magneto-ionic Control of Interfacial Magnetism"; U.S. Appl. No. 61/953,689, filed Mar. 14, 2014.

* cited by examiner

VOLTAGE-CONTROLLED MAGNETIC DEVICES

CROSS REFERENCE TO RELATED APPLICATION

This application claims the benefits of U.S. Provisional Application Ser. No. 62/065,460 filed Oct. 17, 2014, which is hereby incorporated by reference in its entirety, including all figures, tables, and drawings.

This invention was made with government funds under Agreement No. HR0011-13-3-0002 awarded by DARPA; Contract No. ECCS-1310338 awarded NSF; and Contract No. DE-AC02-06CH11357 awarded by the US DOE, Office of Science, BES. The U.S. Government has certain rights in this invention.

BACKGROUND

It has been a long sought-after goal to control the magnetic properties of solids by electric fields. In particular, the control of anisotropy of magnetic materials can be used to implement various devices. The advantages of voltage-induced changes to magnetic properties (such as anisotropy) include substantially greater energy efficiency than that of magnetic fields and spin-polarized currents, and novel functionalities that cannot be realized in conventional devices.

BRIEF SUMMARY

Voltage controlled magnetic components are described. Through application of voltage, a small electric field can be used to change magnetic anisotropy energy of a voltage controlled magnetic component based on control of both saturation magnetization and anisotropy field in a ferromagnetic structure.

A magnetic component can include a ferromagnetic layer adjacent a layer of oxide. Application of an external electric field alters magnetic properties of the ferromagnetic layer via voltage-induced reversible oxidation in the ferromagnetic layer. The magnetic state of the magnetic component can be changed from a current state to a desired state using the external electric fields and then operated according to its application while in the desired magnetic state.

In one embodiment, a wireless system is provided that includes voltage controlled magnetic components. Certain embodiments of a wireless system can include an antenna formed of a ferromagnet/oxide stack and coupled to an operating controller that, through application of a voltage to the antenna, adjusts the operating frequency of the antenna to support multiple operating frequencies for a same antenna.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DISCLOSURE

Figure 1A:
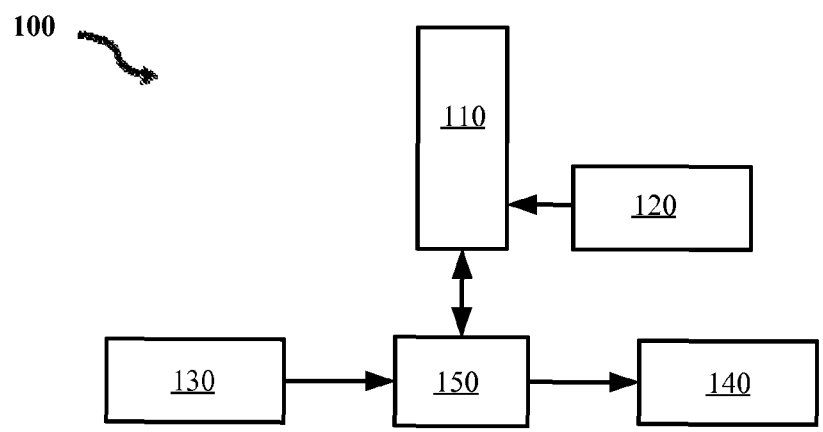
FIG. 1A shows a simplified diagram of a wireless system according to certain embodiments.

Voltage controlled magnetic components are described. As shown in the examples provided herein, it is found that application of an external electric field causes reversible oxidation in ferromagnetic films that are adjacent to an oxide. The reversible oxidation reflects the simultaneous control of both the saturation magnetization and anisotropy field, which results in the ability to change magnetic anisotropy energy with a small electric field.

There are two basic properties of a ferromagnet: saturation magnetization and magnetic anisotropy. These two basic properties are usually intrinsic and fixed once the ferromagnet has been prepared. By application of a particular gate voltage, these two intrinsic properties can be completely controlled. For example, it is possible to modulate the saturation magnetization from zero to its normal value and the magnetic anisotropy from zero to any anisotropy state such as the in-plane state or perpendicular state through a gate voltage. Note the anisotropy is also a quantitative parameter. The modulation of anisotropy also includes modulating the strength of the anisotropy, for example, by changing the anisotropy from a weak perpendicular anisotropy to a strong anisotropy. The described voltage control can be used to optimize performance of devices that function based on the magnetic properties of ferromagnetic materials.

A magnetic component can include a ferromagnetic layer adjacent a layer of oxide. Application of an external electric field alters magnetic properties of the ferromagnetic layer via voltage-induced reversible oxidation in the ferromagnetic layer. The ferromagnetic layer may include Fe, Co, Ni, rare earth elements and/or their alloys. The oxide layer can be selected from, for example, $Gd_2O_3$, MgO, TiOx, TaOx, and HfOx.

Various circuitry can be coupled to the magnetic component to apply voltage to an electrode on the oxide layer while coupling the ferromagnetic layer to a ground or lower rail line. In some cases, the various circuitry are in the form of an operating controller. The particular components in the operating controller (or other circuitry) depend on the specific application in which the magnetic component is provided. For example, magnetic memory may include a read/write controller that can be configured to perform the described adjustment of magnetic properties.

The circuitry coupled to the magnetic component to apply voltage to the electrode on the oxide layer while coupling the ferromagnetic layer to a ground or lower rail line can generate a first external electric field by application of a particular voltage to the electrode and can generate a second external electric field by adjusting the voltage applied to the electrode to a higher or lower voltage. The magnetic properties of the ferromagnetic layer caused by the first external electric field can be reversed or partially reversed by the second external electric field. This behavior is described in detail with respect to FIGS. 4A-4E.

In a case where the magnetic component and circuitry are part of a magnetic memory device, the changes of the magnetic properties by application of the particular voltages to a gate electrode of the magnetic component can be used to decrease the writing current density and increase writing speed. In addition, change of these magnetic properties can be used to alter the coupling field between two ferromagnets of a MRAM cell, improving the performance by improving data operation speed.

In a case where the magnetic component is part of an electromagnetic wave device, the change of the magnetic properties of the ferromagnetic layer can be used to tune the work frequency of the device in the GHz/THz band. In some cases, the change of these magnetic properties can be used to tune the refractive index in metamaterial, and realize the 'invisibility' function in GHz/THz band of electromagnetic waves.

In one embodiment, a wireless system is provided that includes voltage controlled magnetic components. Antenna design generally focuses on shape and size to control gain and directionality during operation. The operating frequency of an antenna informs the antenna design since length and frequency are related (and therefore optimal operation for a particular application uses certain shaped and sized antenna). Certain embodiments of a wireless system can include an antenna formed of ferromagnetic material and coupled to an operating controller that, through application of voltage to the antenna, adjusts the operating frequency of the antenna.

As mentioned above, the saturation magnetization of a magnetic material is fixed upon initial formation of the magnetic material. Therefore, the range of operating frequencies of an antenna having ferromagnetic material would be fixed upon formation (and based in part on the shape and size of the antenna). The operating controller is included to apply a gate voltage to the magnetic material of the antenna to change the magnetic properties of the antenna after initial magnetization/formation. These voltage control effects may be optimized in an environment where the temperature is greater than room temperature (greater than 26° C.). In some cases, the wireless system, or at least the antenna, is operated in an environment where the ambient temperature is elevated, or by adding a heating element to, or near, the antenna. For example, a temperature of approximately 200° C. may be used.

Figure 1B:
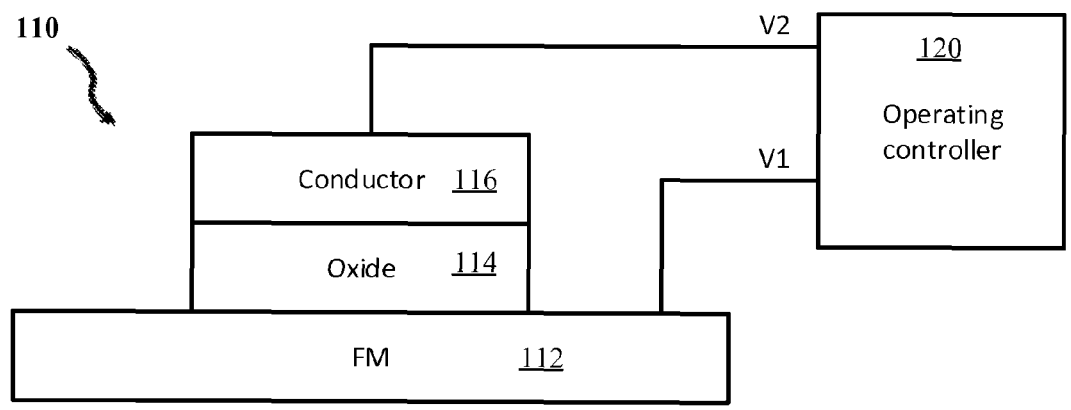
FIG. 1B shows a representation of an example antenna for the wireless system of FIG. 1A.

FIG. 1A shows a simplified diagram of a wireless system according to certain embodiments; and FIG. 1B shows a representation of an example antenna for the wireless system of FIG. 1A.

According to certain embodiments, a wireless system 100 can include an antenna 110 formed, for example, of a ferromagnetic material 112 adjacent to an oxide layer 114 and an operating controller 120 coupled to the antenna 100 to apply voltage (V2-V1) across the ferromagnetic material 112 and conductor 116 (providing a gate electrode on the oxide layer 114) sufficient to generate an electric field. It should be understood that other material layers can be included as part of the antenna 110. In addition, the antenna (and other components) may be formed on a substrate (not shown) and embedded in insulators (not shown).

The wireless system 100 can further include a transmitter 130, a receiver 140, or both the transmitter 130 and the receiver 140 (e.g., as a transceiver). The transmitter 130 may include any suitable transmitter circuitry known in the art. Similarly, the receiver 140 may include any suitable receiver circuitry known in the art. For a case where the wireless system 100 includes a transceiver, the transmitter 130 and receiver 140 can be selectively coupled to the antenna 110 by switch 150 according to the mode of operation for the wireless system 100. When in a transmit mode of operation, the electrical signals from the transmitter 130 will feed into the antenna 110. Conversely, when in a receive mode of operation, electromagnetic signals from the antenna 110 will feed into the receiver 140.

In receive mode, electromagnetic waves that excite the ferromagnetic material 112 of the antenna 110 through ferromagnetic resonance (FMR), which then produces electrical signals for information manipulation by the receiver 140. The frequency of the detected electromagnetic waves strongly depends on the saturation magnetization and magnetic anisotropy of the ferromagnetic material used in the antenna 110. Because an antenna is a reciprocal element, meaning it has the same gain properties whether it is transmitting or receiving, exciting the ferromagnetic material 112 allows for frequency changes in both directions.

The operating controller 120 may be analog, digital, or of mixed signal devices. In some cases, operating controller 120 includes a processor or field programmable gate array (FPGA) and may even include volatile or non-volatile storage. The operating controller 120, based on external programming or internal signals, applies a voltage signal to the antenna 110 that can be tailored to the desired range of operating frequencies of the wireless system 100. The range of operating frequencies of the antenna 110 can be modified by varying the voltage (e.g., adjusting V2 while maintaining V1 at a ground or lower rail line).

The magnetic properties of a ferromagnetic material is typically characterized by two intrinsic properties that are fixed upon magnetization: magnetic anisotropy ($H_A$) and magnetic saturation ($M_S$). By applying a voltage to the ferromagnetic material (e.g., via gate 116 and a contact to the ferromagnetic material 112) at a temperature range of, for example 27° C.-400° C., it is possible to modulate the saturation magnetization from zero to its normal (i.e. intrinsic) value and modulate the magnetic anisotropy from zero to any anisotropy state, such as the in-plane state or perpendicular state. In some cases, a heater (not shown) can be included as part of the wireless system 100 in order to apply an appropriate temperature to the ferromagnetic material (e.g., 27° C.-400° C.). The heater maybe include resistors or materials that generate heat when an applied voltage or current is provided or conductive materials that direct heat from a heat source towards the magnetic component. The magnetic properties of the ferromagnetic material 112 can be affected as described in detail with respect to FIGS. 4A-4E.

For example, from an initial state for the ferromagnetic material 112 of a perpendicular magnetic anisotropy, the operating controller 120 can apply a particular voltage via conductor 116 for a particular amount of time until the ferromagnetic material 112 changes to a state with an in-plane magnetic anisotropy. By applying a voltage of opposite polarity, the ferromagnetic material 112 can change from the in-plane magnetic anisotropy state to the perpendicular magnetic anisotropy state.

From a state for the ferromagnetic material 112 of a perpendicular magnetic anisotropy, the operating controller 120 can apply a particular voltage (which may be the voltage of the opposite polarity as mentioned above) via conductor 116 for a particular amount of time until the ferromagnetic material 112 changes to a state with a zero magnetization. From a state of the zero magnetization, the ferromagnetic material 112 can be changed to the perpendicular magnetic anisotropy and even to the in-plane magnetic anisotropy by application of a particular voltage for a particular amount of time (for example using a voltage of the same polarity as that applied when the initial sate is perpendicular magnetic anisotropy).

It should be understood that this method (and inclusion of a controller) is applicable to a variety of devices incorporating a ferromagnetic material adjacent an oxide (due to the reversible oxidation that can occur as recognized by the inventors). Indeed, the application of a voltage with appropriate time duration can set the ferromagnetic layer to a desired state. For example, a first voltage can be applied to a conductor on the oxide to generate a first electric field having a first polarity or a second voltage can be applied to the conductor to generate a second electric field having a second polarity opposite the first polarity. The first and second voltages can be voltages of the same magnitude, but opposite polarity, voltages of the same magnitude, but applied for different durations, or voltages of different magnitudes, but that achieve the results of opposite directionality of electric field. The use of the numbering "first", "second", and the like as a modifier to "voltage" is not intended to indicate a required order or that the values are different. Rather, the modifier can be considered to distinguish between a particular instance, action, or result (e.g., due to duration of application).

In some cases, the operating controller 120 identifies the desired operating frequency for a particular application (either by receiving an explicit command or by identifying conditions indicative of selection of the particular desired operating frequency) and selects the voltage V1 and V2 to apply to the antenna 110 so that a corresponding desired operating frequency can be achieved. For example, the operating controller 120 may include one or more registers or storage mechanisms in which voltage information is stored (and looked up based on an identified desired frequency). Once the antenna is set to an appropriate operating frequency by the operating controller 120, the antenna can perform according to its expected function for receiving or transmitting signals. At a time that the operating frequency is desired to be changed, the operating controller 120 can apply the appropriate voltage(s) for the appropriate amount of time and then the antenna can be used again for receiving or transmitting.

Figure 2:
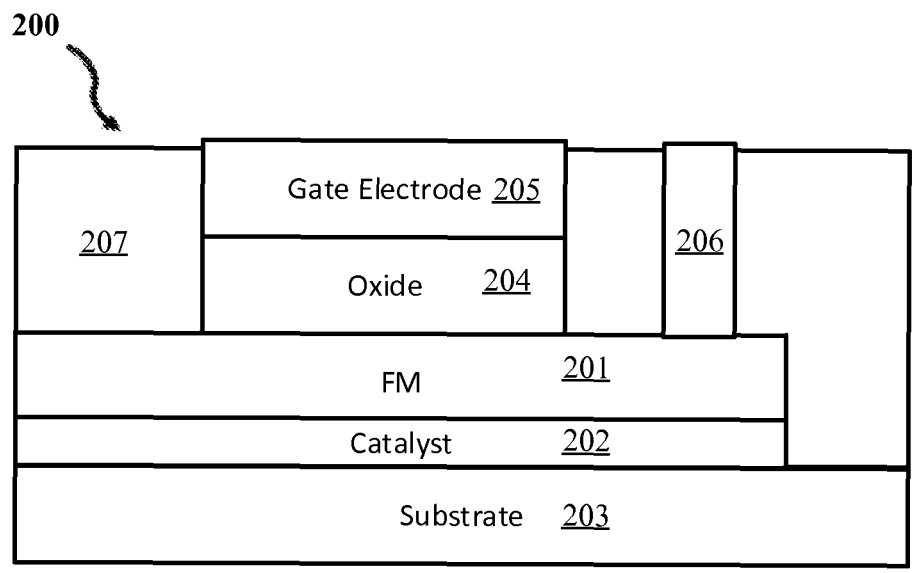
FIG. 2 shows an example ferromagnetic device that may be used in a variety of applications.

FIG. 2 shows an example ferromagnetic device that may be used in a variety of applications. Referring to FIG. 2, a ferromagnetic device 200 can include ferromagnetic material 201, which may be formed on a catalyst layer 202 on a substrate 203. A gate oxide 204 is provided on the ferromagnetic material and a gate electrode 205 is provided on the gate oxide 204. The voltage control effects are greatest when an electric field (from an applied voltage) is applied to the ferromagnetic material 201 that is adjacent to the gate oxide 203, for example by application of a gate voltage to the gate electrode 205 with ground (or a lower rail) connected to the ferromagnetic material 201 (via contact 206 through insulator 207). The layers of materials can be deposited by method of sputtering or another method best suited to the application and integration of the materials forming the ferromagnetic device with other devices on the substrate.

In an example embodiment, a ferromagnetic material 201 such as Co, is deposited onto a silicon or $SiO_2$ substrate 203 using Pt as a catalyst layer 202. A gate oxide layer 204 of $GdO_x$ is then deposited onto the Co ferromagnetic layer 201. $GdO_x$ refers generally to gadolinium oxide films such as, but not limited to, $Gd_2O_3$. The gate electrode 205 can be formed of layers of Tu and Ru that are deposited on the gate oxide 204.

The magnetic properties of the Co film adjacent to the $GdO_x$ can be directly manipulated by external electric fields applied at the $Co/GdO_x$ interface based on application of a gate voltage to the gate electrode 205 with the ferromagnetic material 201 connected to ground or a rail line via contact 206. In particular, the anisotropy and magnetic saturation of the Co (or other ferromagnetic film) can be reversibly changed depending on the polarity and time duration of the applied voltage(s), which induces an electric field. The electric field is induced within a temperature range of, for example, 27° C.-400° C. Large changes in the magnetic anisotropy energy can be realized in a nonvolatile manner using gate voltages of only a few volts. This method allows ultra-low energy magnetization manipulation in devices such as spintronic devices and the above described antenna.

Both the saturation magnetization and anisotropy field of the ferromagnetic layer can be simultaneously controlled by electric fields in a nonvolatile manner, resulting in a large change in magnetic anisotropy energy with a small electric field. As illustrated in more detail in the experimental examples, this effect is achieved by voltage-induced reversible oxidation of the ferromagnetic layer (Co in this case), which can be understood by a large interfacial electric field and the high $O^{2-}$ ion mobility in the oxide layer ($GdO_x$ for this example, which is an ionic conductor with a very high oxygen vacancy mobility). Applying a negative electric field will drive $O^{2-}$ towards the Co layer therefore dramatically altering the magnetic properties of Co.

Accordingly, method of operating a ferromagnetic component can include providing a ferromagnetic component comprising a ferromagnetic layer adjacent an oxide layer; applying an adjustable voltage to a conductor on the oxide layer to change a magnetic state of the ferromagnetic layer from a current state to a desired state; and while in the desired state, operating the ferromagnetic component according to its application. The available states for the desired state include in-plane magnetic anisotropy, perpendicular magnetic anisotropy, and zero magnetization (that can be identified, for example, as a magnetization beyond/below the detection limit of XMCD). For memory applications, the ferromagnetic component can be operated according to its application by performing a write or read operation after reaching the desired state. For wireless applications, the ferromagnetic component can be operated according to its application as an antenna by receiving or transmitting signals (e.g., data).

EXPERIMENTAL EXAMPLES

Figure 3A:
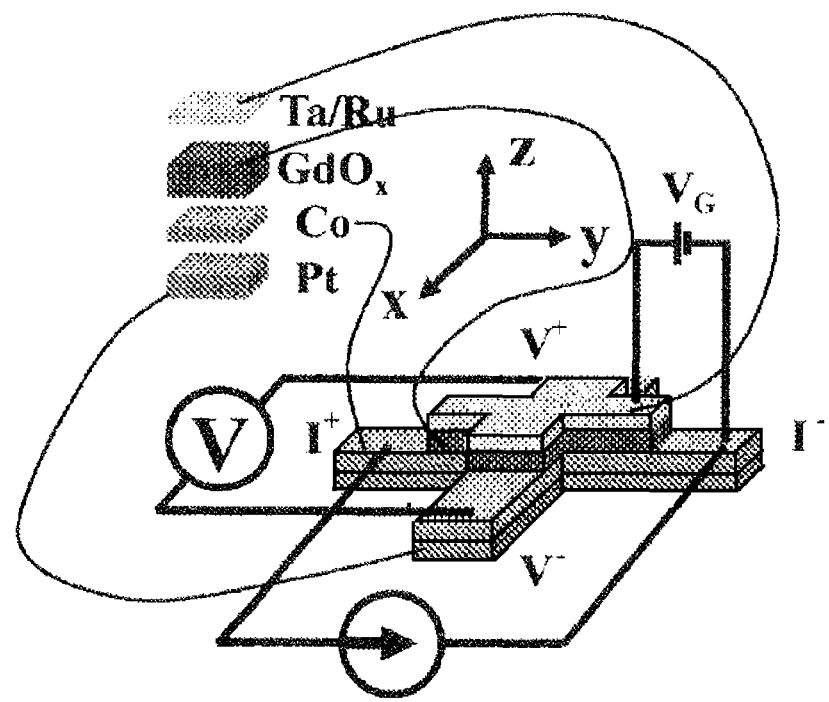
FIG. 3A shows a schematic of a sample ferromagnetic structure and its measurement geometry.

FIG. 3A shows a schematic of a sample ferromagnetic structure and its measurement geometry. The nominal structure of the samples is $Si/SiO_2/Pt$ (4 nm)/Co (0.7 nm)/$Gd_2O_3$ (80 nm)/Ta(5 nm)/Ru(100 nm) (where the $Si/SiO_2$ substrate and $SiO_2$ protective layers are not shown). The $Co/Gd_2O_3$ films were deposited on thermally oxidized silicon substrate by DC magnetron sputtering at a base pressure of $5\times10^{-8}$ Torr. The deposition rate is less than 0.5 Å/s for all layers. In particular, the $Gd_2O_3$ layer was deposited by reactive sputtering from a metal Gd target. A metal Gd layer ~1 nm was first deposited before introducing oxygen into sputtering chamber, which is a common method to avoid oxidation of under layers. By using standard photolithography and ion beam etching, samples were patterned into Hall bar structures with a feature width of 2.5 μm. Subsequently, Ta(5 nm)/Ru(100 nm) gate electrodes were patterned to complete the structure shown in FIG. 3A. In the micro-fabrication process, a 100 nm $SiO_2$ layer was deposited immediately after each etching process before breaking the vacuum, so all edges of the samples were protected by $SiO_2$ layer and were not exposed in atmosphere.

Figure 3B:
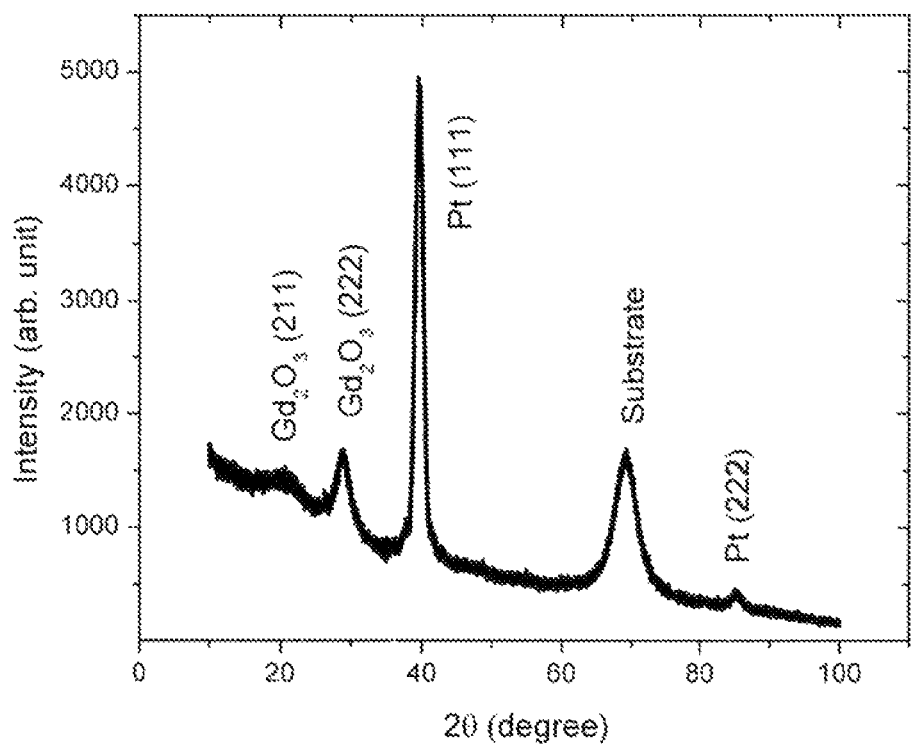
FIG. 3B shows the x-ray diffraction pattern of the sample ferromagnetic structure.

The Philips X'Pert MPD was used to determine the crystal structure of samples having the film structure of $Si/SiO_2/Pt$ (4 nm)/Co (0.7 nm)/GdOx (80 nm). FIG. 3B shows the x-ray diffraction pattern of the sample ferromagnetic structure. The Gadolinium oxide films deposited at room temperature show a crystalline structure instead of being amorphous The two peaks at $2\theta=20.4°$ and $2\theta=28.8°$ can be indexed as the (211) and (222) diffraction peaks of cubic $Gd_2O_3$ with a lattice constant of 10.8 Å. The Pt buffer layer is <111> oriented evident from the strong (111) peak at 39.5° and the (222) peak at 85.2°. The broad peak at ~69.2° is due to the Si substrate, which is not observed for films deposited on a glass substrate.

Figure 3C:
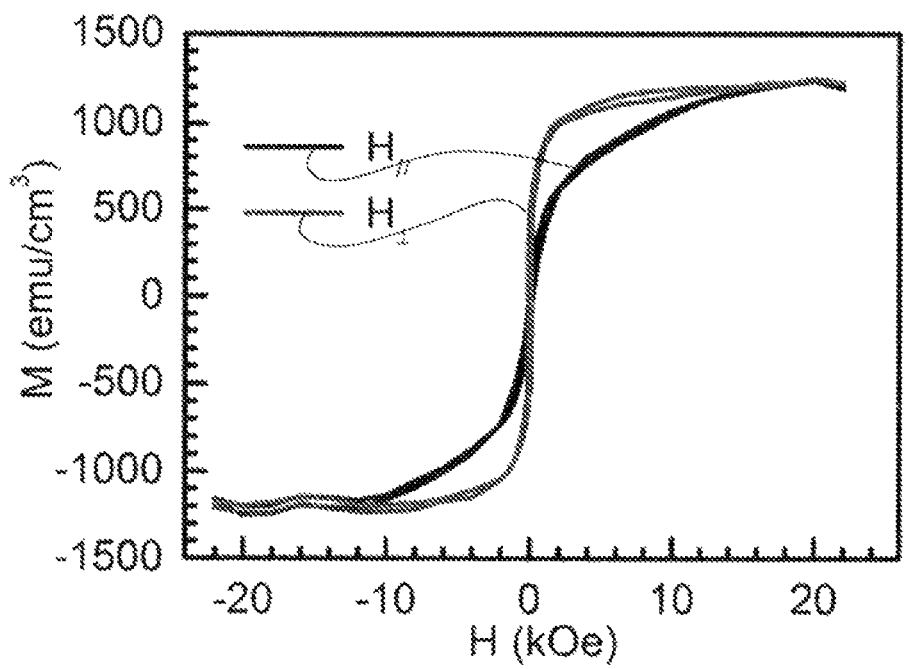
FIG. 3C shows hysteresis loops of the sample ferromagnetic structure (as deposited).

FIG. 3C shows hysteresis loops of the sample ferromagnetic structure (as deposited). The hysteresis loops were measured by a vibrating sample magnetometer (Microsense, EZ9 series) with magnetic fields applied in the in-plane and perpendicular-to-plane orientation. This plot shows that the saturation magnetization and perpendicular anisotropy field are about 1200 emu/cm$^3$ and 12.5 kOe, respectively. The background signals from the substrate and sample holder have been subtracted.

X-ray magnetic circular dichroism (XMCD) measurements were performed using beamline 4-ID-C at the Advanced Photon Source in order to determine the oxidation states and the magnetization of Co layers. Circularly polarized x rays were used to obtain absorption spectra recorded by fluorescence yield. The X-ray spot was focused to be 150×150 μm$^2$. The XMCD (XAS) spectra are given by the difference (sum) between the absorption spectra of the right and left circularly polarized x-rays. Data were collected by tuning the X-ray energy at Co $L_{2,3}$ edge, with an incident beam angle of 70° with respect to the film plane and with an applied magnetic field of 3.5 kOe perpendicular to the film plane. The data are normalized by the x-ray intensity and then the edge jump before and after the $L_3$ edge of the average absorption spectra. The XMCD and XAS spectra provide the element-specific information on valence holes and magnetism FIGS. 3D and 3E show the $R_H$-$H_Z$ curves of the sample of FIG. 3A under certain conditions; and FIG. 3F shows the $R_H$-$H_Y$ curves of the sample of FIG. 3A.

The anomalous Hall effect (AHE) was used to characterize the magnetic properties of patterned samples after the application of electric fields. Electric fields were applied at elevated temperatures ranging between 200° C. and 260° C. to illustrate the dramatic effect of voltage-controlled magnetism in this system. All of the transport measurements were conducted with zero electric field after samples were cooled to room temperature.

Figure 3D:
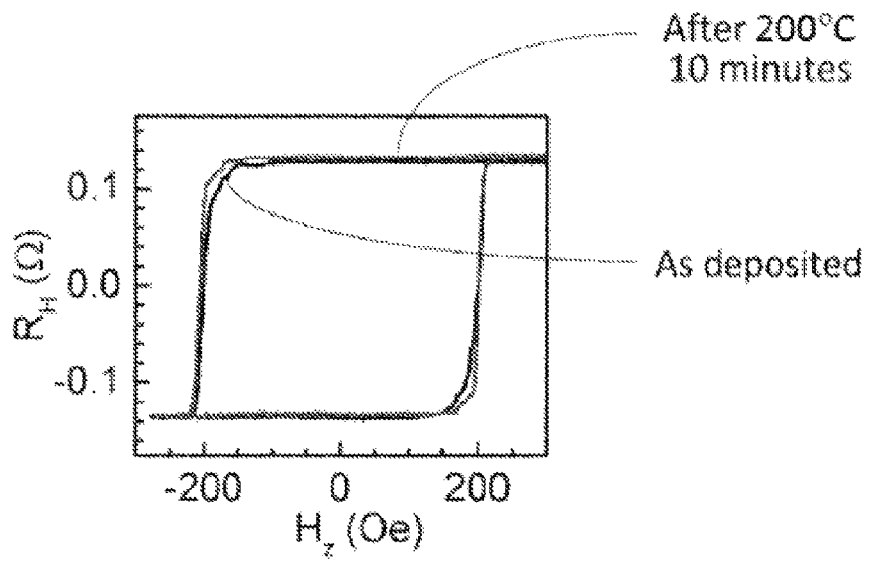
FIGS. 3D and 3E show the $R_H$-$H_Z$ curves of the sample of FIG. 3A under certain conditions.

FIG. 3D shows the $R_H$-$H_Z$ curves of the sample of FIG. 3A where $R_H$ was measured as a function of a perpendicular external field ($H_Z$) for the as-deposited sample. The square $R_H$-$H_Z$ curve indicates that the virgin sample shows a strong perpendicular magnetic anisotropy (PMA) with the coercive field ($H_C$) of 200 Oe and the amplitude of $R_H$ of 0.27Ω. The AHE curve of the sample after staying at 200° C. for 10 mins without any electric field applied is also plotted in FIG. 3D. The two curves closely resemble each other, demonstrating that heating alone has little impact on the sample's magnetic properties.

Figure 3E:
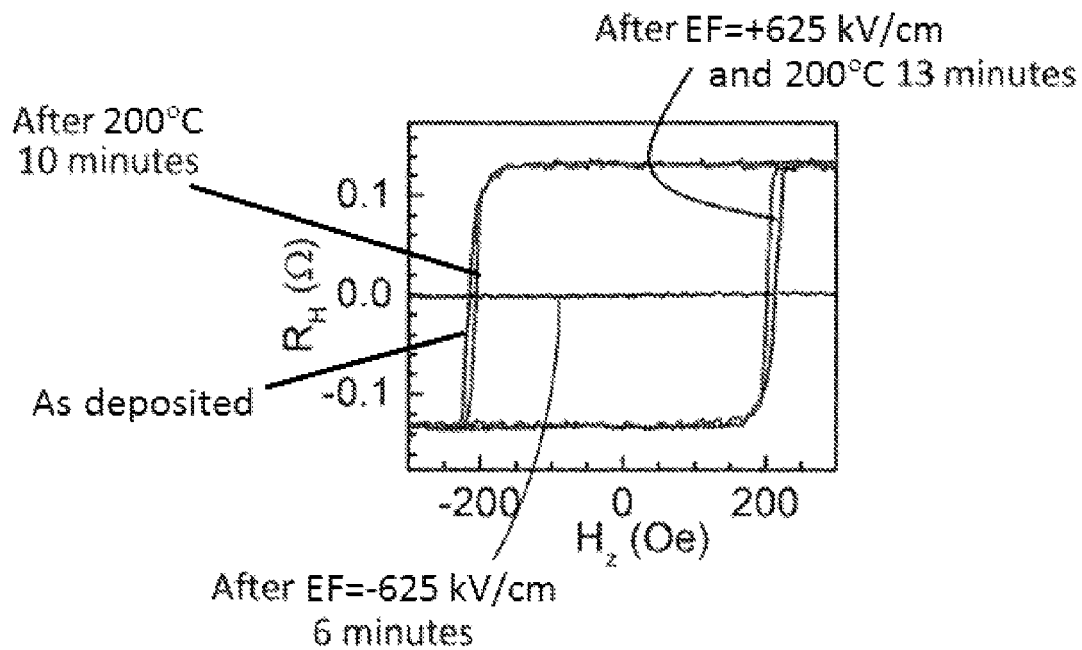
Figure 3F:
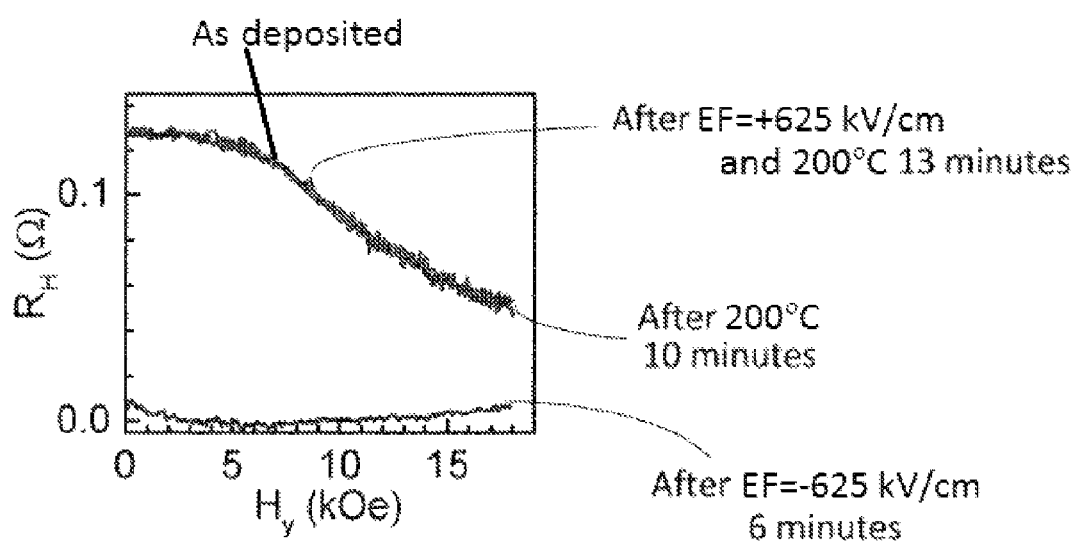
FIG. 3F shows the $R_H$-$H_Y$ curves of the sample of FIG. 3A.

FIG. 3E shows the $R_H$-$H_Z$ curves of the sample of FIG. 3A after the application of a small electric field of −625 kV/cm (corresponding to a gate voltage of −5V) at 200° C. and after the application of a small electric field of +625 kV/cm (corresponding to a gate voltage of +5V) at 200° C. The AHE hysteresis loop for the −625 kV/cm electric field nearly disappears under this condition with the line at 0Ω. The $R_H$-$H_Z$ curve for this case now only shows a very weak ordinary Hall signal, which doesn't saturate at high $H_Z$ (not shown), suggesting that the vanish of $R_H$ is not due to in-plane anisotropy. Also at the same time, as shown in FIG. 3F, the $R_H$-$H_Z$ curve measured with an in-plane magnetic field ($H_Y$) also vanishes (showing as a line that is near 0Ω). These facts indicate that the applied negative electric field has a profound influence on the magnetism of the Co layer. Since the AHE curves were measured after the electric field was turned off, the observed nonvolatile behavior here cannot be caused by the charge transfer effect. Instead, the behavior implies that the change is caused by electric field-driven ion motion.

Remarkably, the PMA can be completely restored. Returning to the plot shown FIG. 3E, after applying a positive electric field of 625 kV/cm for 13 mins at 200° C., $R_H$ curves were measured at room temperature. As shown in FIG. 3E, the $R_H$-$H_Z$ curve for this case is almost fully recovered to its initial shape. The longitudinal resistance of the Hall bars changed less than 5% after the entire process. The same $R_H$-$H_Z$ curves indicate both the $M_Z$ and $H_C$ were recovered after the positive electric field. Moreover, the $R_H$-$H_Z$ curve under the in-plane field is also completely restored as shown FIG. 3F. This hard-axis AHE curve directly links to the anisotropy field of the perpendicular Co layer. Its recovery after the positive electric field further confirms the PMA has been reversibly changed to its initial state.

To summarize: first, the magnitude of the anisotropy change for the Co/GdOx structure is truly giant when compared to the charge-transfer-induced VCMA effects. Vibrating sample magnetometry (VSM) studies on these perpendicularly magnetized $Pt/Co/Gd_2O_3$ films showed a saturation magnetization of 1200 emu/cm$^3$ and an anisotropy field of 12.5 kOe as shown (and described) with respect to FIG. 3B. This translates to an effective surface perpendicular energy density, $K^\perp \cdot t$ ($K^\perp = \frac{1}{2}M_S \cdot H_A$ and t is the thickness of the film) of 0.53 erg/cm$^2$, controlled entirely by a small electric field of 625 kV/cm.

By comparison, a large electric field of ~10 MV/cm is required for a change of ~0.02 erg/cm$^2$ in a Ta/CoFeB/MgO (configured for a magnetic tunnel junction (MTJ)) system. Second, the magnetism control is reversible; this may seems counter-intuitive since the chemical reaction near FM/oxide interface is typically understood to be an irreversible process. The results, including additional experiments described below, demonstrate that the ionic migration and subsequent chemical reaction processes in $Co/Gd_2O_3$ are reversible. Finally, the magnetism control is nonvolatile; this is in a sharp contrast with the conventional VCMA in which the effect comes from electric field-induced electron density redistribution and thus intrinsically suffers volatility.

In another example, to further confirm the discovery of giant electric field-controlled magnetism, a direct link between the amount of interfacial CoOx modulated by the electric field and the strength of the PMA is desirable. FIGS. 4A-4F show electric field-induced evolution of magnetic properties of the ferromagnetic layer in the sample of FIG. 3A under various applied voltage conditions for different durations. The plots show the evolution of the magnetism of the Co layer measured by AHE.

Prior studies on a trilayer of Pt/Co/AlOx found that a substantial amount of interfacial CoOx was crucial to the strong PMA in Pt/Co/AlOx, whereas in-plane magnetic anisotropy was observed in under-oxidized samples and PMA with multi-domain structure was observed in over-oxidized samples. For the subject experiments, the electric fields were applied in the samples shown in FIG. 3A at a moderately higher temperature of 260° C.

Figure 4A:
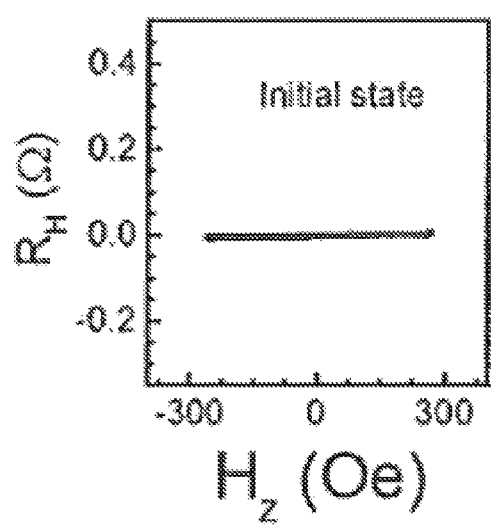
FIGS. 4A-4F show electric field-induced evolution of magnetic properties of the ferromagnetic layer in the sample of FIG. 3A under various applied voltage conditions for different durations.
Figure 4B:
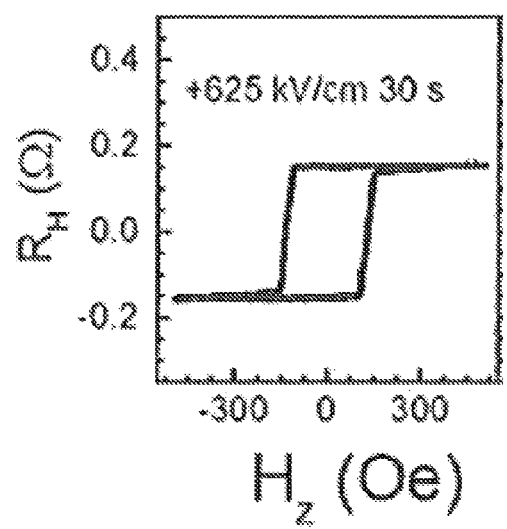
Figure 4C:
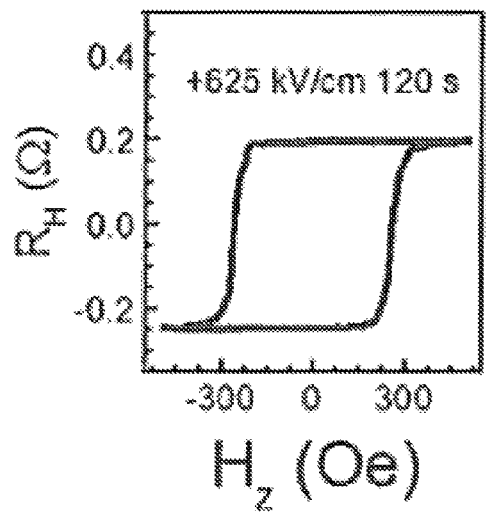

Referring to FIG. 4A, the device is initially in the zero magnetization state created by a negative electric field. As shown in FIG. 4B, upon application of +625 kV/cm for only 30 s, the AHE curve nearly returns to the as-deposited state shown in FIG. 3D. Then, turning to FIG. 4C, after the application of the positive electric field for 120 s, the AHE curve exhibits a larger $H_C$ and larger $R_H$ compared to the as-deposited state, indicating the Co film now has a stronger PMA. $H_C$ of the Co layer continues increasing with further application of a positive electric field until 150 s, after which $H_C$ starts to decrease, accompanied with the decrease of $R_H^R/R_H^S$ ($R_H^R$ and $R_H^S$ are the remanent and saturated Hall resistance, respectively). $R_H^S$ continues increasing in the entire duration of positive electric field application. Indeed, as shown in FIG. 4D, after 600 s, the AHE curve exhibits a hard-axis hysteresis loop for the out-of-plane field, with a $R_H^S$ being nearly doubled that of the as-deposited state and a negligible $H_C$.

To return the ferromagnetic material to the zero magnetization state reflected in FIG. 4A, a negative electric field can be applied. For example, FIG. 4E shows the AHE curve after an electric field of −625 kV/cm was applied for 10 s, which shows the PMA state. Continuing to 30 s of applied electric field of −62 kV/cm, it can be seen in FIG. 4F that the Co film of the ferromagnetic structure can be restored to the initial state. The restoration to the initial state from the PMA state by the negative electric field can be accomplished in a much shorter time scale as changing the magnetization from the initial state to the PMA state.

Figure 4D:
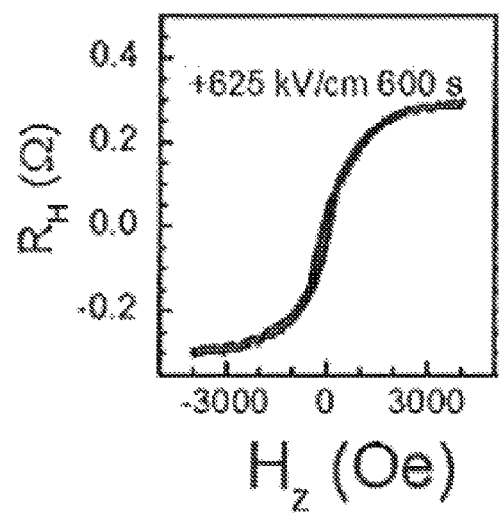
Figure 4E:
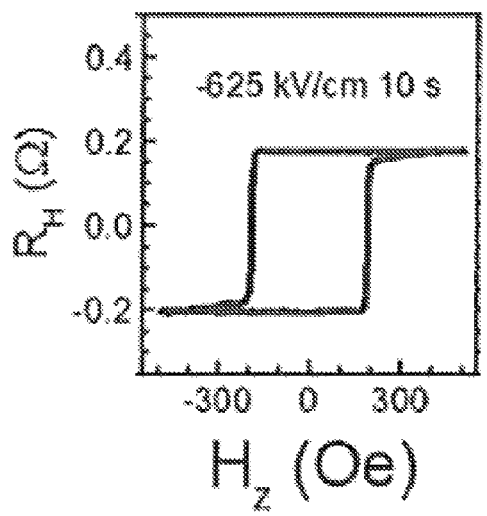
Figure 4F:
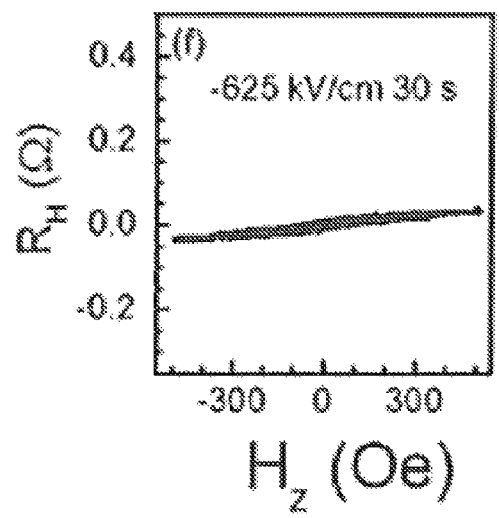

The observation of a hard-axis like AHE curve in FIG. 4D is significant. $R_H$ in this state doesn't reach saturation until $H_z$=3000 Oe. This fact, together with the nearly zero $R_H^R/R_H^S$ ratio, indicates that the easy axis of Co film has been turned to the in-plane orientation.

Figures 5A, 5B:
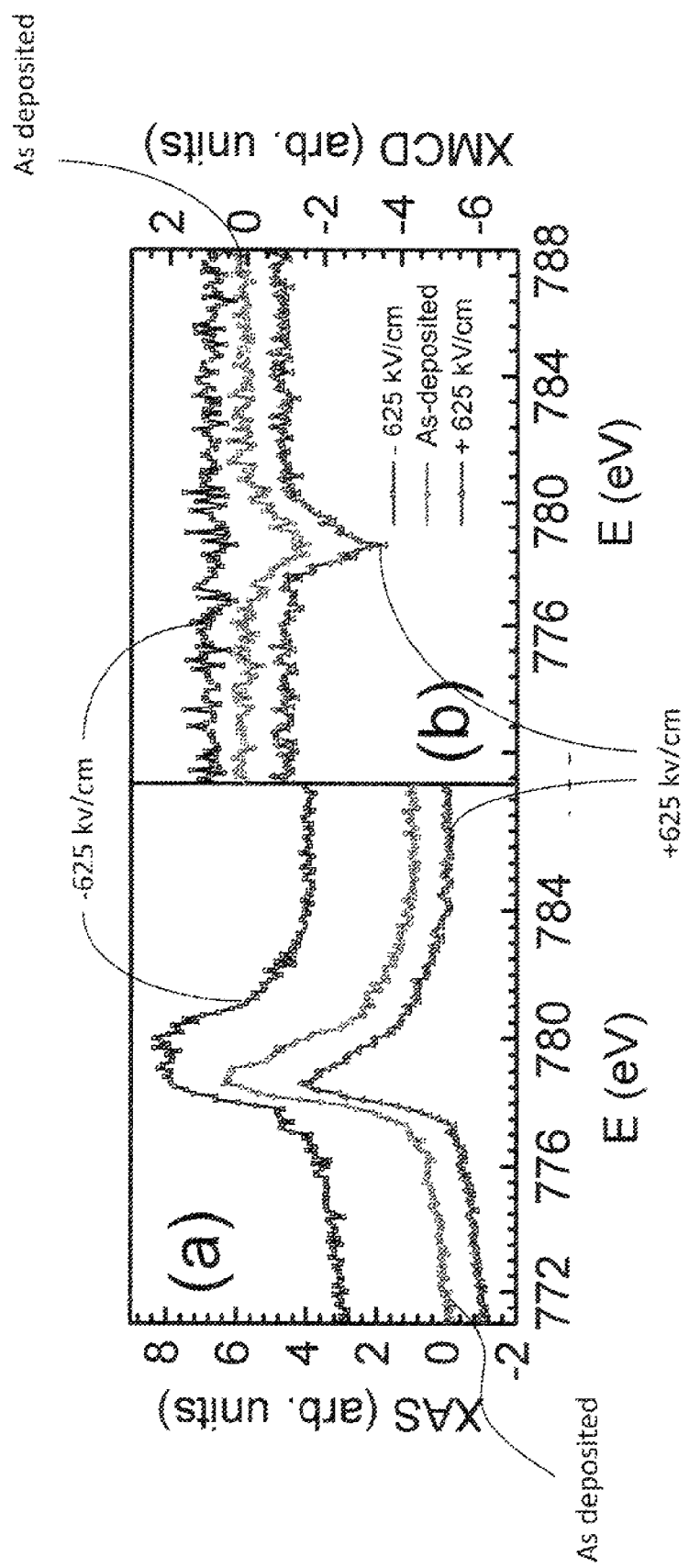
FIGS. 5A and 5B show the normalized x-ray absorption spectra and x-ray magnetic circular dichroism spectra, respectively, at the Co $L_3$ edge under the different applied electric fields.

In order to measure the Ms as well as the oxidation state of Co films, XMCD (X-ray magnetic circular dichroism) experiments were performed before and after the application of electric fields. FIGS. 5A and 5B show the normalized x-ray absorption spectra and x-ray magnetic circular dichroism spectra, respectively, at the Co $L_3$ edge under the different applied electric fields.

Referring to FIG. 5A, it can be seen that the Co $L_3$ edge absorption peak of the sample in the as-deposited state has a main Co peak at 778.6 eV and a shoulder that is clearly visible at 779.8 eV, indicative of an interfacial CoOx layer between pure Co and $Gd_2O_3$ that is expected for samples with strong PMA. As a compliment, FIG. 5B shows the normalized XMCD signal at the $L_3$ edge. The total magnetic moment per Co atom calculated from the sum rule is 0.92±0.10 μB, which is reasonably close to 1.05±0.10 μB determined from the VSM measurement.

The intensity sum rule states that the transition intensity is proportional to the valence hole number $n_h$ when summed over the $L_{2,3}$ peak. Using this rule, it was found that the ratio of 3d hole per Co atom is 1:1.24:1.38 for the +5 V, the as-grown, and the −5 V samples, respectively.

The spin and orbit moments of the Co magnetization were quantitatively estimated using the XMCD sum-rule in units of μB/atom:

$$m_{orb} = -n_h \frac{4\int_{L3+L2}(\mu_+ - \mu_-)dE}{3\int_{L3+L2}(\mu_+ + \mu_-)dE}$$

$$m_{spin} = -n_h\left(1 + \frac{7\langle T_z\rangle}{2\langle S_z\rangle}\right)^{-1}\frac{2\int_{L3}(\mu_+ - \mu_-)dE - 4\int_{L2}(\mu_+ - \mu_-)dE}{3\int_{L3+L2}(\mu_+ + \mu_-)dE},$$

where μ+(μ−) is the absorption intensity with left (right) circular polarized x-rays, $n_h$ is the number of holes in the d shells. The factor $$\frac{7\langle T_z\rangle}{2\langle S_z\rangle}$$

is typically very small (a traction of 1%) for metallic Co films, and thus can be ignored. The photon incident angle (70°) has been taken into account by multiplying by [1/cos (70°)].

The XAS spectrum of the +5V sample is almost identical to metallic Co. The reported values of 3d hole number in metallic Co are between 2.5 and 2.8 per atom for metallic Co. Using these values, the lower and upper limits of the spin (orbital moment) are calculated to be 1.61 (−0.05) μB and 1.80 (−0.05) μB per Co atom, respectively, for the +5 V sample. For the fresh sample, the lower and upper limits of the spin (orbital moment) are calculated to be 0.74 (0.13) μB and 0.83 (0.14) μB per Co atom, respectively. The −5 V sample did not show appreciable magnetization.

As can be seen from FIGS. 5A and 5B, the sample shows a completely different behavior after the application of an electric field of −625 kV/cm for 10 min at 260° C. In particular, the shoulder at 779.8 eV for the as deposited sample turned into a peak for the negative electric field sample. Two other peaks at 777.3 eV and 782.2 eV, characteristic of CoO, start to emerge as well, making the spectrum almost identical to that of CoO. Stronger evidence of a $Co^{2+}$-dominating state is that the peaks at 778.6 eV and 779.8 eV are of the same height, consistent with a loss of metallic Co in the film. At the same time, there is no detectable magnetic signal in the XMCD spectrum as shown in FIG. 5B. These results indicate that no isolated Co particles remain, and almost the entire Co film has been oxidized into CoO by the negative electric field driven $O^{2-}$ migration.

The sample shows nearly metallic behavior after the application of positive electric field (e.g., +625 kV/cm under the same conditions. The Co $L_3$ peak is much narrower with no shoulders and the peak position is consistent with metallic Co. The total moment per Co atom determined from the XMCD measurement is 1.65±0.10 μs, very close to the value of pure Co (1.6 μB), demonstrating the in-plane easy axis observed in FIG. 4D indeed was due to the formation of pure Co by the application of positive electric field. With these results, it is estimated that Co/Gd$_2$O$_3$ system can be changed between an in-plane state with K$^\|$·t=0.20 erg/cm2 to a strong PMA state with K$^\perp$·t=0.53 erg/cm2, reaching a total surface anisotropy energy density change of 0.73 erg/cm$^2$ only by a small electric field of 625 kV/cm, equivalent to a magneto-electric effect of 11.6 pJ/Vm. This unprecedented control of magnetism is more than two orders of magnitude larger than the normal VCMA effect of 30-50 fJ/Vm in CoFeB/MgO or Fe/MgO.

Figure 6A:
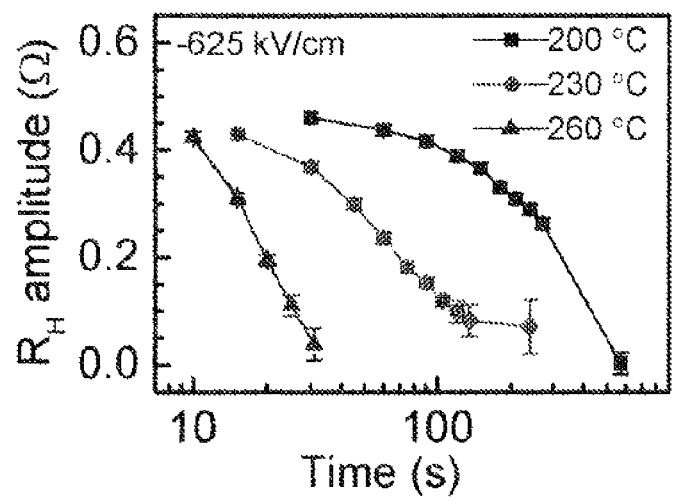
FIGS. 6A-6D illustrate the dynamic behavior of the sample at different temperatures.
Figure 6B:
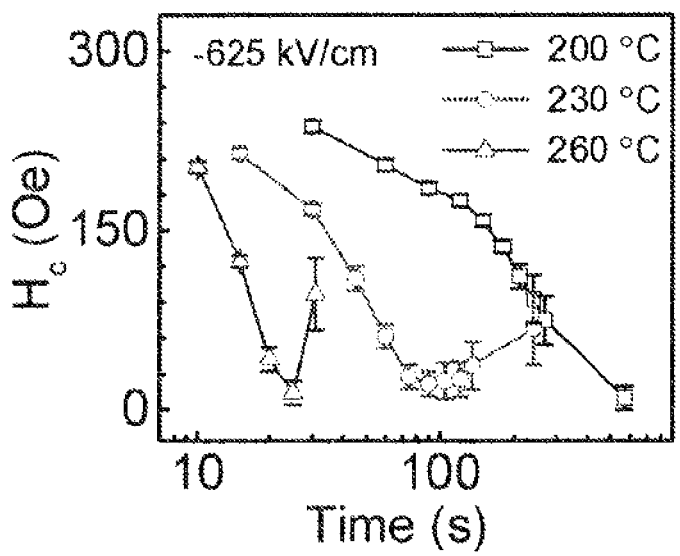
Figure 6C:
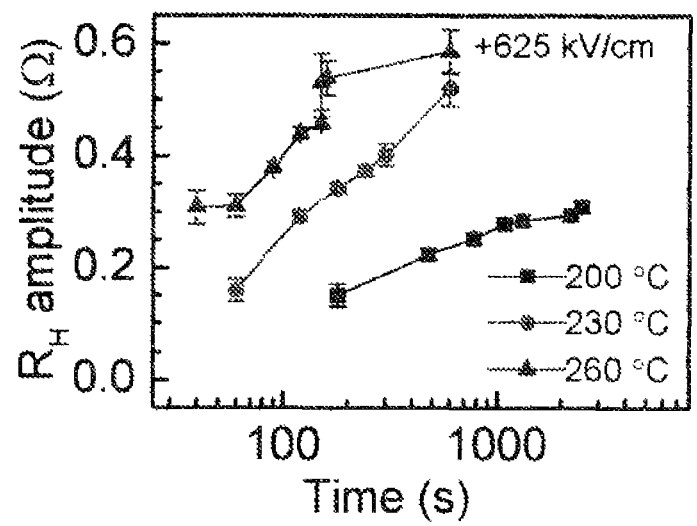
Figure 6D:
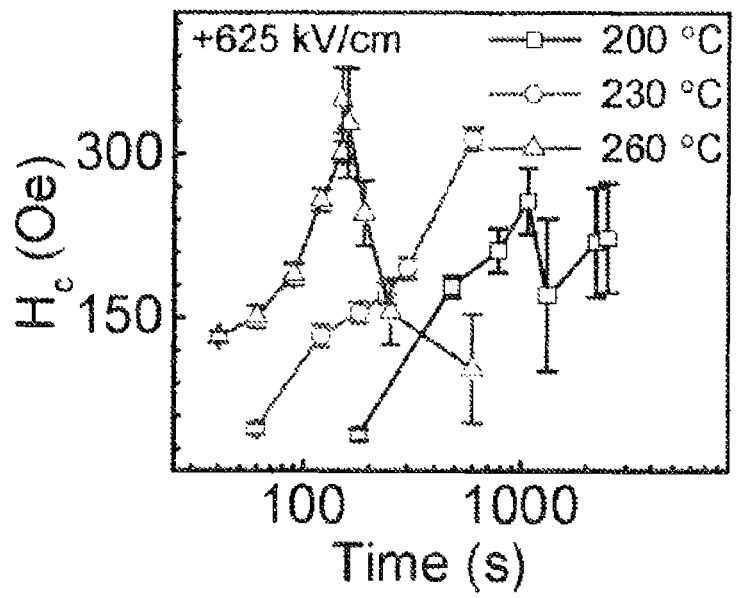

FIGS. 6A-6D illustrate the dynamic behavior of the sample at different temperatures. For positive electric field, the initial state of the sample included the oxide CoO (and corresponded to the state shown in FIG. 4A), while for negative electric field the initial state of the sample reflected the pure Co (and corresponded to the state shown in FIG. 4D). Thermally activated behavior is evident from the very different time scales at different temperatures. As shown in FIG. 6C, while it takes 3000 s to achieve $R_H^{S=0.3}\Omega$ with +625 kV/cm at 200° C., it only takes 30 s at 260° C. As shown in FIG. 6D, H$_C$ reaches a maximum around 105 s with +625 kV/cm at 260° C., and starts to decline after this point clue to the decrease of $R_H^R/R_H^S$. Note this maximum value of H$_C$ could not be achieved at lower temperatures under the amount of time explored. Clearly, as reflected by the times shown in FIGS. 6A and 6B as compared to the times shown in FIGS. 6C and 6D, the control of magnetism under a negative electric field is much faster than that for positive electric field. For example, it takes 600 s to change CoO state to pure Co with +625 kV/cm at 260° C.; but it only takes 30 s to return to the nearly fully oxidized state. This difference is likely related with the asymmetric CoO/Gd$_2$O$_3$ barrier and the additional energy required for nucleation of metallic Co.

The observed giant reversible control of magnetism may be qualitatively explained by the unique electric properties of Gd$_2$O$_3$. The voltage dropped within the Gd$_2$O$_3$, $V_{Gd2O3}$, and the voltage across the Co/CoO$_x$ interface layer $V_{int}$, may be estimated by utilizing the boundary condition at the interface, $$\varepsilon_0 \frac{V_{int}}{\lambda} = \varepsilon \frac{V_{Gd2O3}}{L},$$

where $\lambda$ is the thickness of CoOx layer including the screening length of metallic Co layer and L is the thickness of Gd$_2$O$_3$ layer. By using $V_{int}+V_{Gd2O3}=V_g$ along with the above relation, the voltage drop across the interface is $$V_{int} = \frac{\varepsilon_r \lambda V_g}{\varepsilon_r \lambda + L}.$$

If $\varepsilon_r$=22, $\lambda$=0.4 nm, L=80 nm, and Vg=5 V, then $V_{int}$=0.5 V, which generates an interfacial electric field that is nearly 20 times larger than the average electric field of 625 kV/cm. With this significant voltage across the interface, the mobile oxygen ion near the interface is able to overcome the electronic barrier of CoO$_x$ so that the thermally assisted oxygen ion transport becomes possible. Reversibly, when the bias voltage is positive, the oxygen ion in Co/CoO$_x$ moves into Gd$_2$O$_3$ in the presence of the positive electric field. While this interpretation provides plausible explanation to the observed effects, several issues should be addressed in order to fully understand the physics involved.

Among them, the dielectric constant, interface oxygen concentration, and electric field dependence of Co and CoO$_x$ mixture at the interface should be carefully characterized before a quantitative picture can be used to explain the dynamic behaviors shown in FIGS. 6A-6D.

Although the time scale (seconds) in the present example is large, it is possible to dramatically reduce this by optimizing the FM/oxide interfacial structures, considering the resistance change due to the voltage-driven O$^{2-}$ motion can be very fast (ns) as demonstrated in certain memristor devices. The high temperature in this example (200° C.-260° C.) is also well within the accessible range in, for example, heat assisted magnetic recording or thermally-assisted MRAM switching. Another important point is that the lattice constant of the cubic Gd$_2$O$_3$ obtained in this example has only a 5% mismatch to CoFe. Therefore it is possible to realize this giant magnetism control in CoFe (001)/Gd$_2$O$_3$ (001)/CoFe (001) MTJs with large magnetoresistance.

This example demonstrates that the magnetism of ultra-thin Co films can be controlled by voltage-driven reversible oxidation with a strong asymmetric behavior for electric fields with different polarities. A giant change of magnetic anisotropy energy up to 0.73 erg/cm$^2$ has been achieved by applying a small gate voltage of a few volts, which can be qualitatively understood by a large interfacial electric field and the high O$^{2-}$ mobility in Gd$_2$O$_3$. These results provide a new pathway to achieve voltage-controlled spintronic devices by directly manipulating the oxidation states of 3D transitional FMs.

It should be understood that the examples and embodiments described herein are for illustrative purposes only and that various modifications or changes in light thereof will be suggested to persons skilled in the art and are to be included within the spirit and purview of this application.

What is claimed is:

1. A method of operating a ferromagnetic component, the method comprising:
   providing a ferromagnetic component comprising a ferromagnetic layer and an oxide layer directly on top of the ferromagnetic layer;
   applying an adjustable voltage to a conductor on the oxide layer to change a magnetic state of the ferromagnetic layer from a current state to a desired state, the magnetic states available for the desired state include in-plane magnetic anisotropy, perpendicular magnetic anisotropy, and zero magnetization; and
   while in the desired state, operating the ferromagnetic component according to its application, wherein the ferromagnetic component comprises an antenna, and wherein operating the ferromagnetic component according to its application comprises receiving or transmitting data via the antenna.

2. The method of claim 1, further comprising:
   providing an environment in which a temperature of the ferromagnetic layer is greater than room temperature while applying the adjustable voltage to the conductor on the oxide layer.

3. The method of claim 2, wherein providing the environment comprises providing a heater for the ferromagnetic component.

4. The method of claim 1, wherein applying the adjustable voltage to the conductor on the oxide layer to change the magnetic state of the ferromagnetic layer from the current state to the desired state comprises:
   applying a first voltage to the conductor to generate a first electric field having a first polarity or applying a second voltage to the conductor to generate a second electric field having a second polarity opposite the first polarity.

5. The method of claim 4, wherein for the current state of nearly zero magnetization and the desired state of perpendicular magnetic anisotropy, the applying the adjustable voltage comprises: applying the first voltage for a first amount of time;
wherein for the current state of nearly zero magnetization and the desired state of in-plane magnetic anisotropy, the applying the adjustable voltage comprises: applying the first voltage for a second amount of time greater than the first amount of time.

6. The method of claim 4, wherein for the current state of perpendicular magnetic anisotropy and the desired state of nearly zero magnetization, the applying the adjustable voltage comprises: applying the second voltage for a first amount of time;
wherein for the current state of perpendicular magnetic anisotropy and the desired state of in-plane magnetic anisotropy, the applying the adjustable voltage comprises: applying the first voltage for a second amount of time.

7. The method of claim 6, wherein the second amount of time is greater than the first amount of time.

8. The method of claim 4, wherein for the current state of the in-plane magnetic anisotropy and the desired state of perpendicular magnetic anisotropy, the applying the adjustable voltage comprises: applying the second voltage for a first amount of time;
wherein for the current state of the in-plane magnetic anisotropy and the desired state of nearly zero magnetization, the applying the adjustable voltage comprises: applying the second voltage for a third amount of time greater than the first amount of time.

9. The method of claim 4, wherein the ferromagnetic layer comprises Co, Fe, Ni, or an alloy including at least one of Co, Fe, and Ni, and the oxide layer comprises $Gd_2O_3$, MgO, $TiO_x$, $TaO_x$, $ZrO_x$ or $HfO_x$.

10. A wireless system comprising:
an antenna comprising a ferromagnetic layer, an oxide layer on the ferromagnetic layer, and a conductive layer on the oxide layer; and
an operating controller coupled to the ferromagnetic layer and the conductive layer of the antenna to apply an adjustable voltage to the antenna to generate an electric field in the ferromagnetic layer.

11. The wireless system of claim 10, wherein the operating controller applies the adjustable voltage at a particular voltage for a particular amount of time to change the ferromagnetic layer from a state with a perpendicular magnetic anisotropy to a state with an in-plane magnetic anisotropy.

12. The wireless system of claim 10, wherein the operating controller applies the adjustable voltage at a particular voltage for a particular amount of time to change the ferromagnetic layer from a state with a perpendicular magnetic anisotropy to a state with nearly zero magnetization.

13. The wireless system of claim 10, wherein the operating controller applies the adjustable voltage at a particular voltage for a particular amount of time to change the ferromagnetic layer from a state with an in-plane magnetic anisotropy to a state with a perpendicular magnetic anisotropy.

14. The wireless system of claim 10, wherein the operating controller applies the adjustable voltage at a particular voltage for a particular amount of time to change the ferromagnetic layer from a state with nearly zero magnetization to a state with a perpendicular magnetic anisotropy.

15. The wireless system of claim 10, wherein the operating controller generates the electric field having a strength of between −625 kV/cm and +625 kV/cm.

16. The wireless system of claim 10, wherein the ferromagnetic layer comprises Co, Fe, Ni, or an alloy including at least one of Co, Fe, and Ni, and the oxide layer comprises $Gd_2O_3$, MgO, $TiO_x$, $TaO_x$, $ZrO_x$ or $HfO_x$.

17. The wireless system of claim 10, further comprising:
a heater for heating the antenna to a temperature between about 27° C. and 400° C.

18. The wireless system of claim 10, further comprising at least one of a transmitter and a receiver coupled to the antenna.

* * * * *